US005835999A

United States Patent [19]

Grosspietsch et al.

[11] Patent Number: 5,835,999

[45] Date of Patent: Nov. 10, 1998

[54] LOW POWER REGENERATIVE FEEDBACK DEVICE AND METHOD

[75] Inventors: John Grosspietsch, Vernon; Lindo St. Angel, Palatine, both of Ill.

[73] Assignee: Motorola, Inc., Schaumburg, Ill.

[21] Appl. No.: 660,624

[22] Filed: Jun. 6, 1996

Related U.S. Application Data

[63] Continuation of Ser. No. 433,205, May 17, 1995, abandoned.

[51] Int. Cl.[6] .......... H03K 5/08

[52] U.S. Cl. .......... 327/328; 327/170; 327/391; 327/374; 327/112

[58] Field of Search .......... 327/74, 170, 389, 327/391, 374, 376, 377, 111, 112, 316, 323, 328, 332, 333; 326/87

[56] References Cited

U.S. PATENT DOCUMENTS

| | | | |
|---|---|---|---|
| 3,851,259 | 11/1974 | Porawski | 327/74 |
| 4,731,553 | 3/1988 | Van Lehn et al. | 326/87 |
| 4,779,013 | 10/1988 | Tanaka | 326/87 |
| 4,958,089 | 9/1990 | Fitzpatrick et al. | 326/87 |
| 4,985,644 | 1/1991 | Okihara et al. | 326/86 |
| 5,293,082 | 3/1994 | Bathaee | 327/170 |
| 5,418,482 | 5/1995 | Wong et al. | 327/374 |
| 5,469,088 | 11/1995 | Sharpe-Geisler | 327/170 |
| 5,528,192 | 6/1996 | Agiman | 327/377 |
| 5,559,447 | 9/1996 | Rees | 326/87 |

*Primary Examiner*—Terry Cunningham
*Attorney, Agent, or Firm*—Darleen J. Stockley

[57] ABSTRACT

A low power regenerative feedback device and method automatically increases bias current during positive large-signal slewing, enabling output to change faster. When the device is not in a positive slew, bias currents are unchanged, providing a low standby current. Since regenerative feedback is internal and automatic to the device, current is increased only for the device driving an active column of an LCD panel. Thus, the present invention is power efficient. In addition, the AC response of the device is preserved because the device utilizes a regenerative feedback circuit that does not add appreciable excess phase shift. The device achieves an output that switches readily from positive supply to negative supply.

11 Claims, 4 Drawing Sheets

*FIG. 1*
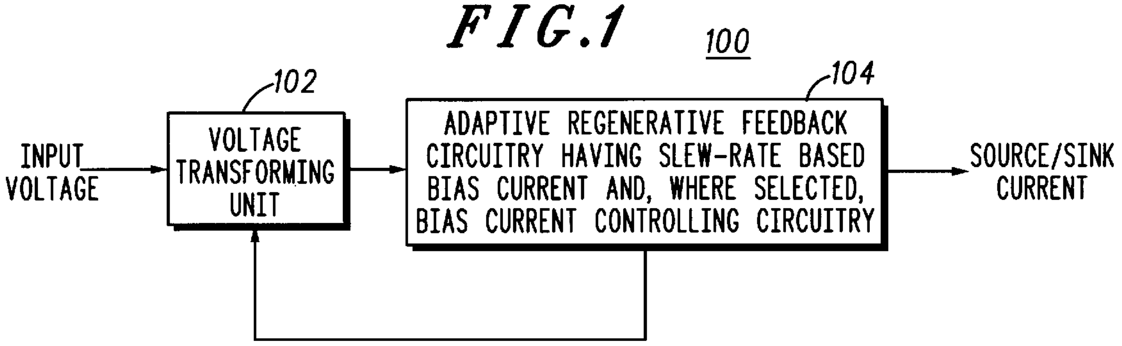
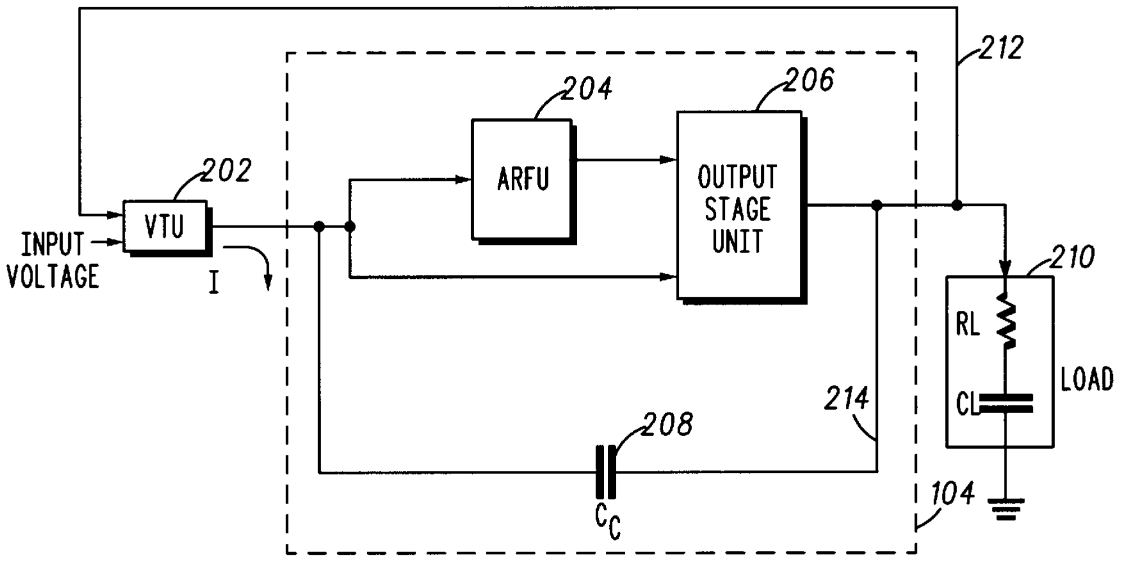
*FIG. 2*

400

LOW POWER REGENERATIVE FEEDBACK DEVICE AND METHOD

This is a continuation of application Ser. No. 08/433,205, filed May 17, 1995 and now abandoned.

FIELD OF THE INVENTION

This invention relates generally to multistage transistor amplifiers, and more particularly, multistage transistor amplifiers arranged in integrated circuit form.

BACKGROUND

Multistage amplifiers have been developed in integrated circuit (IC) forms for use as operational amplifiers (OP AMPS). An amplifier is defined as operational when feedback path components, instead of forward path gain, dominate the amplifier behavior. Thus, OP AMP devices are adaptable for use in many applications by the addition of any one of a number of feedback circuits between input and output terminals, and/or by the addition of circuit components to the input or output terminals. Multistage amplifiers must remain stable when used with selected feedback networks under the required operating conditions, i.e., multistage amplifiers must not oscillate at any frequency with the feedback network selected.

Since OP AMPS on integrated circuits are very small, it is desirable to employ them in numerous electrical products, such as liquid crystal display (LCD) panels. A typical supertwist nematic (STN) monochrome LCD panel has 1,280 columns (640 upper and 640 lower), each of which represents a large capacitive load, e.g. 400 picofarads, that an individual OP AMP must drive. The large number of OP AMPS required, one per column, dictates that each amplifier must have a low quiescent current, i.e., less than 10 microamps, to keep total power dissipation to an acceptable level. However, at the same time, each amplifier must be able to rapidly change, e.g., in under 10 microseconds, the voltage on the very capacitive LCD column, requiring a large peak current, e.g. greater than 500 microamps. Previous implementations have utilized a class AB amplifier to meet these requirements. However, such implementations have suffered from high quiescent current levels, unstable alternating current (AC) response, layout consuming complexity, and the inability of the output to go as high as the positive supply or as low as the negative supply, which is important in active addressing LCD displays.

Switched-bias amplifiers, three stage amplifiers, and cascoded output stage amplifiers have been utilized, but also suffer certain impediments. Switched bias amplifiers achieve a fast slew rate from an increase in amplifier bias current during a time when an OP AMP must change the voltage on a particular column. However, rather than changing the bias only to the amplifiers that are driving active columns, the bias to all amplifiers, typically 1280 of them, is increased. Thus, switched bias amplifiers require a high power consumption.

Three stage amplifiers attempt to compensate for the slow pull-up action that is characteristic of output PMOS devices by adding a high gain stage prior to the output PMOS device. These high gain stages usually have poles that are low enough in frequency to make stable closed loop operation difficult, giving a poor, oscillatory AC response.

To increase the PMOS gate drive, some amplifiers use a low gain stage that has sufficiently high bandwidth to give a stable closed loop response. However, these amplifiers have poor quiescent current control, resulting in high bias currents.

Cascoded output stage amplifiers use a complex arrangement of transistors to provide class AB operation. Such amplifiers have adequate AC response and quiescent current, but have a large number of components. In addition, the outputs of these amplifiers cannot go as high as the positive supply or as low as the negative supply.

Thus, there is a need for a low power consumption regenerative feedback device and method that has low quiescent current levels, stable AC response, low bias currents and provides amplifier outputs that can go as high as the positive supply or as low as the negative supply.

BRIEF DESCRIPTIONS OF THE DRAWINGS

FIG. 1 is a block diagram of an embodiment of a device in accordance with the present invention.

FIG. 2 is a block diagram of the embodiment of the device of FIG. 1 shown with greater particularity.

DETAILED DESCRIPTION OF A PREFERRED EMBODIMENT

Figure 3:
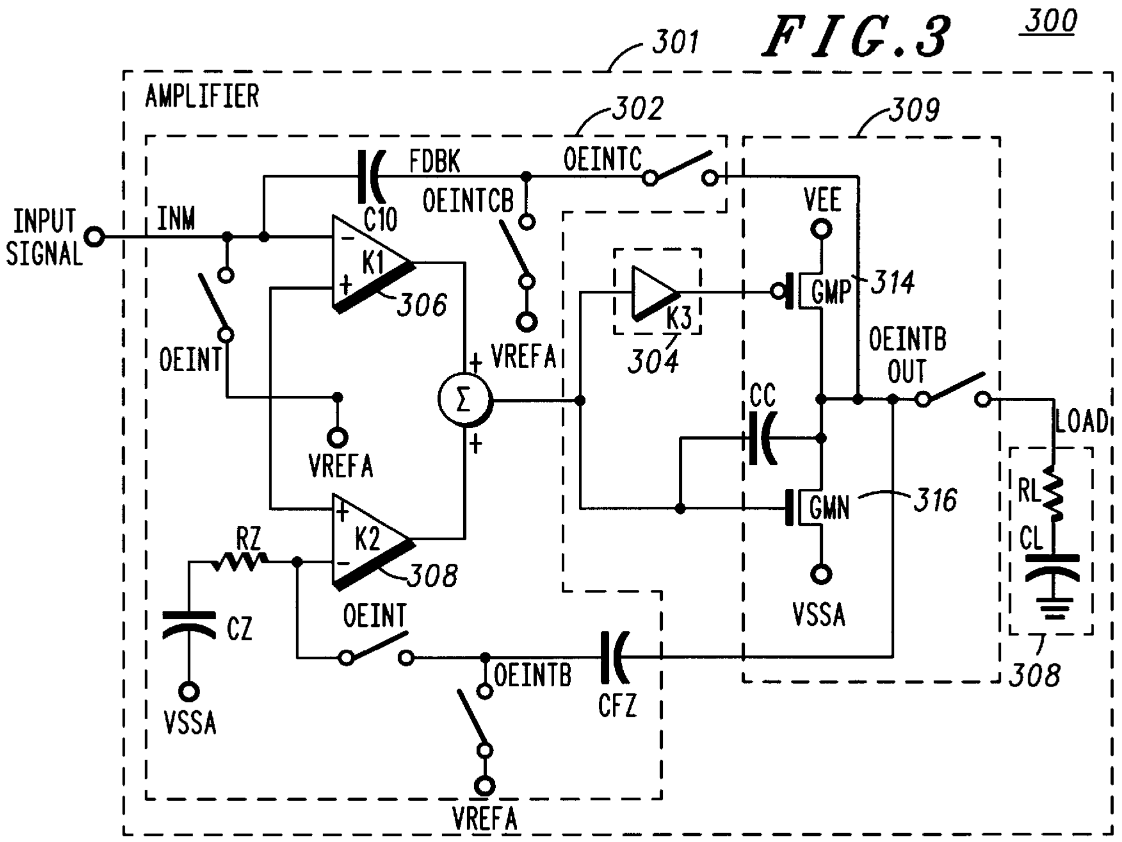
FIG. 3 is a schematic representation of one implementation of an amplifier that includes the device of the present invention.

The present invention provides a low current regenerative feedback device and method that automatically increases bias current during positive large-signal slewing, enabling output to change faster. When the device is not in a positive slew, bias currents are unchanged, providing a low standby current. Since regenerative feedback is internal and automatic to the device, current is increased only for the devices charging columns of an LCD panel. Thus, the present invention is power efficient. In addition, the AC response of each device is preserved because the device utilizes a regenerative feedback circuit that does not add appreciable excess phase shift. The invention achieves an output that switches readily from positive supply to negative supply. The small number of components in the device of the present invention allows a non-complex circuit layout.

FIG. 1, numeral 100, is a block diagram of an embodiment of a device in accordance with the present invention. The device for amplifying signals for supplying current to a load for a portable electronic unit and simultaneously minimizing power usage includes a voltage transforming unit (102) and adaptive regenerative feedback circuitry (104). The voltage transforming unit (102) is used for transforming a received input voltage into a first current using a predetermined gain. The adaptive regenerative feedback circuitry having slew-rate based bias current (104), and where selected, bias current controlling circuitry, is operably coupled to the voltage transforming unit (102) and provides feedback to the voltage transforming unit (102), automatically increasing a bias current of the regenerative feedback circuitry in accordance with positive signal slewing, maintaining bias current substantially unchanged where signal slewing is non-positive, and providing a source/sink current for charging/discharging the load utilizing a minimized power input.

The adaptive regenerative feedback circuitry typically includes bias current controlling circuitry that is operably coupled to the voltage transforming unit, for providing feedback to the voltage transforming unit (102) and providing the source/sink current by adjusting the bias current in accordance with a predetermined scheme. The scheme generally includes: A) setting a plurality of bias currents, utilizing a first current, I1, flowing through a first transistor (PMOS1); and B) providing a negative feedback signal to the voltage transforming unit ; and C) providing, when an output of the amplifier is in positive slew, a feedback signal within the adaptive regenerative feedback circuitry, for increased current through a diode-connected MOSFET (metal-oxide semiconductor field-effect transistor) string that is operably coupled to the first transistor, wherein current also increases through at least one other transistor in parallel with the first transistor and operably coupled to the diode-connected MOSFET string, and a current (I1+I2) further increases through the diode-connected MOSFET string, providing highly responsive load pull-up current; and D) maintaining, where the amplifier output is one of: stable and negative slew, an existing bias current wherein the existing bias current minimizes power usage.

In one embodiment, the first transistor, PMOS1, and the two other transistors, PMOS2 and PMOS3, are p-type metal-oxide-silicon, PMOS, transistors. The bias control circuitry typically includes eight transistors, coupled as follows: A) PMOS1, a device for setting bias currents for PMOS2, PMOS3, and first and second output devices (314, 316); B) PMOS2, operably coupled to PMOS3, a mirrored device receiving an output from PMOS3, for, in response to an increase in output source current, increasing the current through the diode-connected MOSFET string; C) PMOS3, operably coupled with PMOS2 and the first output device (314), a diode-connected device, for, in response to an increase in output source current, providing a signal to PMOS2 for increasing the current (I1+I2) through the diode string in response to an output from the voltage-transforming unit indicating positive slew; D) the diode string, operably coupled to PMOS1 and PMOS2, including: a first n-type metal-oxide-silicon, NMOS7, transistor operably coupled to a fourth p-type metal-oxide-silicon transistor, PMOS5, that is operably coupled to a second n-type metal-oxide-silicon, NMOS8, transistor, wherein the diode string is further coupled to a third n-type metal-oxide-silicon, NMOS6, transistor that is operably coupled to PMOS3 and PMOS2, and to a fifth p-type metal-oxide-silicon transistor, PMOS4, that is operably coupled to the output of the voltage transforming unit (202), in response to current from PMOS1 and PMOS2, providing an increased feedback signal for current indicating a positive slew-rate and maintaining an existing feedback signal for current indicating a non-positive slew-rate.

FIG. 2, numeral 200, is a block diagram of the embodiment of the device of FIG. 1 shown with greater particularity. The device for amplifying signals for supplying current to a load for a portable electronic unit and simultaneously minimizing power usage, includes a voltage transforming unit (202) and adaptive regenerative feedback unit (ARFU; 204) having slew-rate based bias current and where selected, bias current controlling circuitry. The voltage transforming unit (202) is used for transforming a received input voltage into a first current using a predetermined gain. The adaptive regenerative feedback unit (204) is operably coupled to receive a current from the voltage transforming unit (VTU, 202) that causes a voltage at the ARFU (204). The ARFU is used for providing an adjusting signal for controlling a second current of the output unit (206). The output stage unit (206) is operably coupled to the ARFU (204) and to the VTU (202), and is used for providing a source/sink current for charging/discharging a load (210), and where selected, for providing feedback signal (212) to the voltage transforming unit (202). A capacitor (208) is typically placed in a feedback circuit (214) between the output stage unit (206) and the ARFU (204).

Again, the adaptive regenerative feedback circuitry (204) includes bias current controlling circuitry that is operably coupled to the voltage transforming unit (202), for providing feedback to the voltage transforming unit and providing the source/sink current by adjusting the bias current in accordance with the predetermined scheme described above. In this embodiment, the transistors are typically as described above.

FIG. 3, numeral 300, is a schematic representation of one implementation of an amplifier that includes the device of the present invention. The amplifier (301) typically utilizes the device for amplifying an input signal for supplying current to drive a column of a liquid crystal display panel and simultaneously minimizing power usage. The device includes a voltage transforming unit (302), for transforming a received input voltage into a first current using a predetermined gain; B) adaptive regenerative feedback circuitry (304) having slew-rate based bias current and output to a multi-transistor final output stage; and C) the multi-transistor final output stage, operably coupled to the adaptive regenerative feedback circuitry, for determining a final current (I4) to output to a load. In general, the input signal is applied to a first and a second differential amplifier (306, 308) that are arranged to provide their outputs to a summer (310) to provide a predetermined current as is known in the art. In one implementation the voltage at the output of the summer (310) is approximately 1.2 volts. The output of the summer (310) is input to adaptive regenerative feedback circuitry (304) that in turn is coupled to the multi-transistor final output stage that includes first (314) and second (316) preselected transistors. The first preselected transistor (314) and the second preselected transistor (316) are coupled to provide feedback to the first differential amplifier (306) and to the second differential amplifier (308). The combined output of the first and second preselected transistors (314, 316) is provided to a load (308) (represented as $R_L$ and $C_L$), typically a column of a liquid crystal display panel. The load current during slew is I4, which is controlled by I3 (see FIG. 4).

Figure 4:
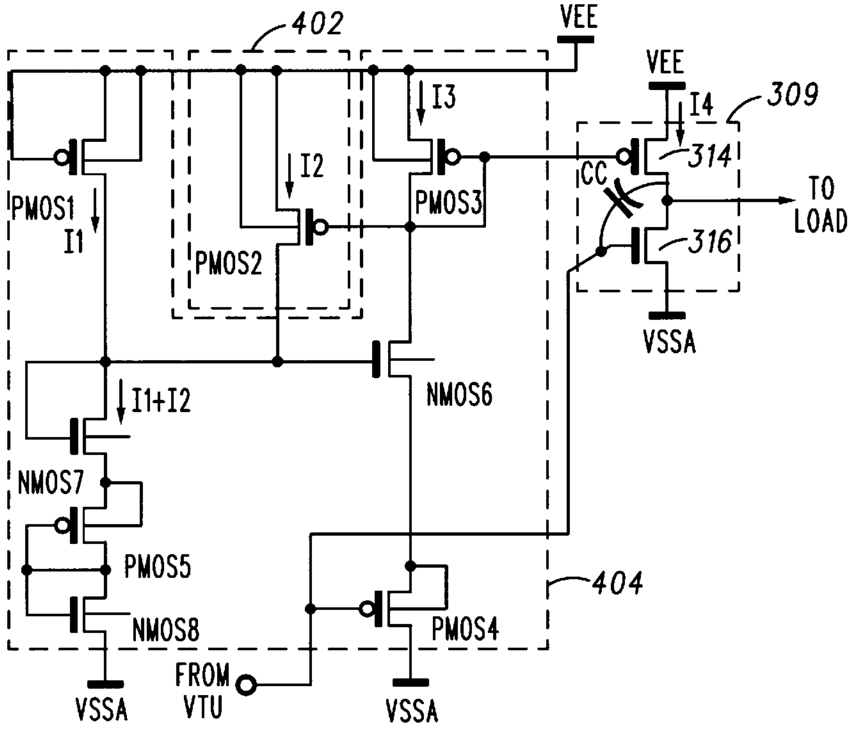
FIG. 4 is a schematic representation of one implementation of a portion of the amplifier utilizing the regenerative feedback arrangement of FIG. 3 in accordance with the present invention.

FIG. 4, numeral 400, is a schematic representation of one implementation of a portion of the amplifier utilizing the regenerative feedback arrangement of FIG. 3 in accordance with the present invention. The regenerative feedback circuitry of FIG. 3 typically comprises: A) a positive feedback device (PMOS2); B) bias circuitry (404); and C) an output stage (309).

PMOS2 (402) provides positive (regenerative) feedback to enhance direct current operation during positive slew. With this positive feedback, the PMOS output device (314) receives a strong gate drive, and the amplifier (301) pulls up the load very quickly. With this positive feedback, the current (I1+I2) through diode string NMOS7, PMOS5 and NMOS8 increases because the feedback device PMOS2

(402) is mirrored off diode device PMOS3 as is the PMOS output device (314). The increased current throughout the diode string causes the current to increase through PMOS3 even more, which causes the currents to increase through the diode string again. All of this has the effect of turning device NMOS6 on very hard by pulling its gate high and hence, the gate of the PMOS output device (314) low.

Typically, a number of field-effect transistor (FET) devices in the amplifier is minimized.

Figure 5:
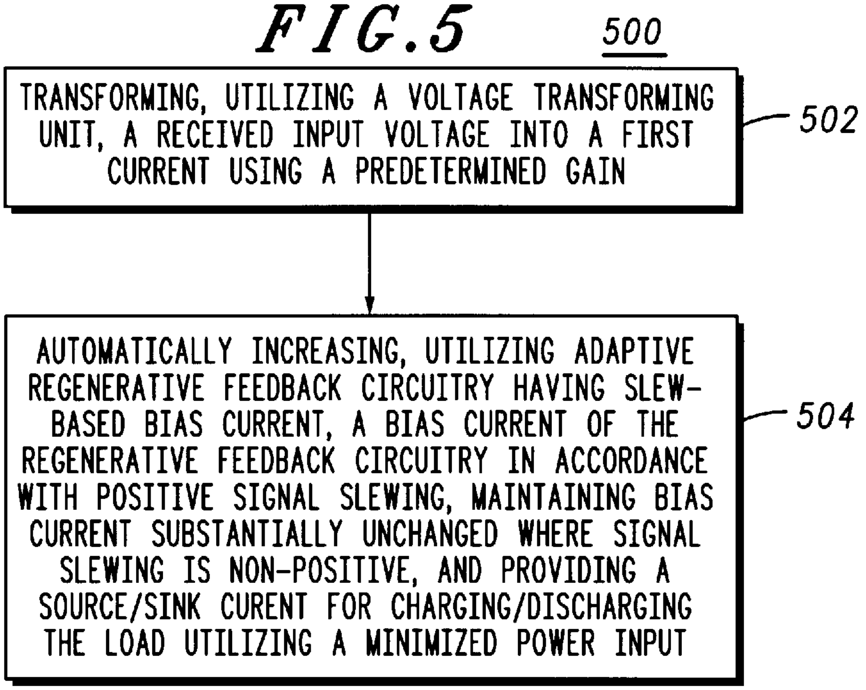
FIG. 5 is a flow chart showing one embodiment of steps in accordance with the method of the present invention.

FIG. 5, numeral 500, is a flow chart showing one embodiment of steps in accordance with the method of the present invention.

The method is utilized for amplifying signals for supplying current to a load for a portable electronic unit and simultaneously minimizing power usage. The method includes the steps of:

A) transforming (502), utilizing a voltage transforming unit, a received input voltage into a first current using a predetermined gain, and B) automatically increasing (504), utilizing adaptive regenerative feedback circuitry having slew-rate based bias current, a bias current of the regenerative feedback circuitry in accordance with positive signal slewing, maintaining bias current substantially unchanged where signal slewing is non-positive, and providing a source/sink current for charging/discharging the load utilizing a minimized power input.

Generally, utilizing the adaptive regenerative feedback circuitry includes utilizing bias current controlling circuitry of the adaptive regenerative feedback circuitry, operably coupled to the voltage transforming unit, for providing feedback to the voltage transforming unit and providing the source/sink current by adjusting the bias current in accordance with the following scheme: A) setting a plurality of bias currents, utilizing a first current, I1, flowing through a first transistor; B) utilizing the bias currents to provide a feedback signal to the voltage transforming unit. Where the feedback signal is positive, increased current is provided through a diode string that is operably coupled to the first transistor, wherein current also increases through at least two other transistors in parallel with the first transistor and operably coupled to the diode string, and current further increases through the diode-connected string, providing highly responsive load pull-up. Where the feedback signal is non-positive, an existing bias current is maintained wherein the existing bias current minimizes power usage. The first transistor, PMOS1, and the two other transistors, PMOS2 and PMOS3, are typically p-type metal-oxide-silicon, PMOS, transistors.

Bias control circuitry generally includes eight transistors as described above.

Figure 6:
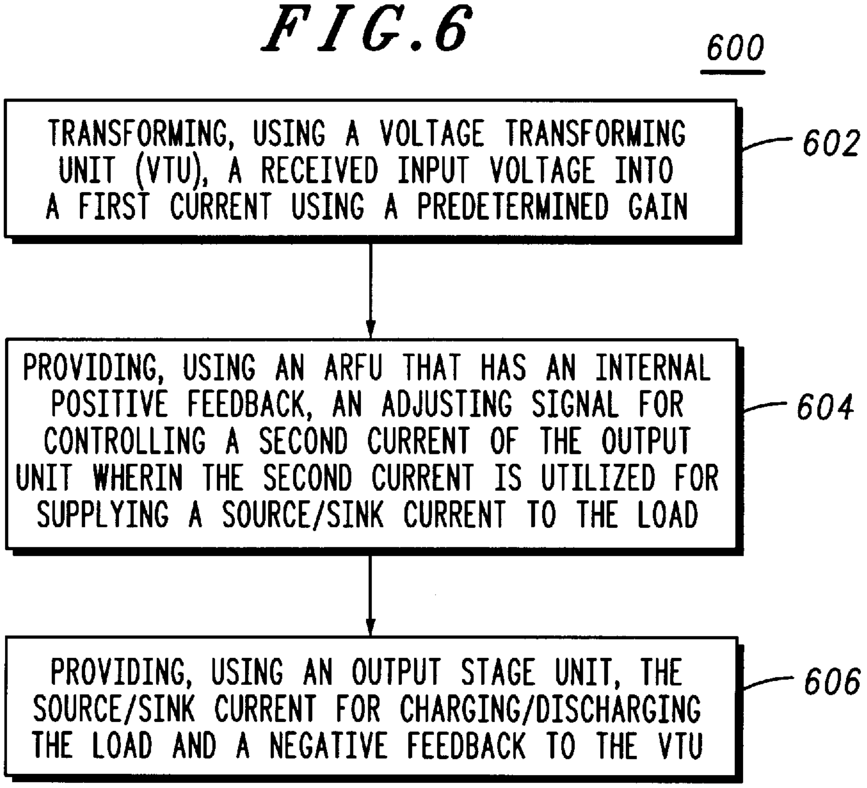
FIG. 6 is a flow chart showing another embodiment of steps in accordance with the method of the present invention.

FIG. 6, numeral 600, is a flow chart showing another embodiment of steps in accordance with the method of the present invention. The method amplifies signals for supplying current to a load for a portable electronic unit and simultaneously minimizing power usage. The method includes the steps of: A) transforming (602), using a voltage transforming unit, a received input voltage into a first current using a predetermined gain, B) providing (606), using an adaptive regenerative feedback unit (204), an adjusting signal for controlling a second current of the output unit wherein the second current is utilized for supplying a source/sink current to the load, and C) providing (606), using an output unit, the positive feedback signal to the adaptive regenerative feedback unit (204) and for providing the source/sink current for charging/discharging the load.

Figure 7:
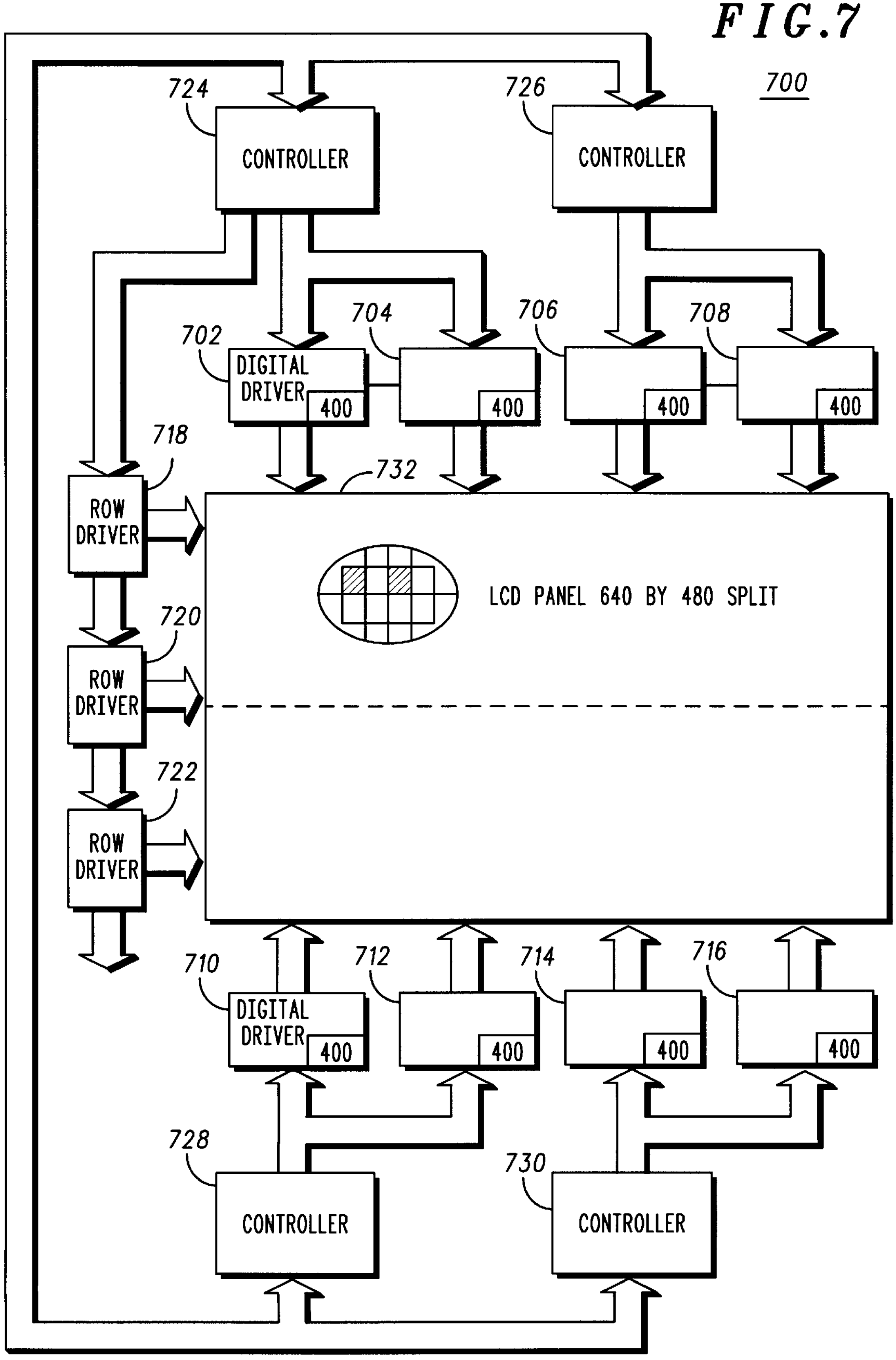
FIG. 7 is a block diagram showing a liquid crystal display panel having digital drivers for amplifying signals for supplying current to drive columns of the liquid crystal display panel and simultaneously minimizing power usage in accordance with the present invention.

FIG. 7, numeral 700, is a block diagram showing a liquid crystal display (LCD) panel having digital drivers (702, 704, 706, 708, 710, 712, 714, 716) for amplifying signals for supplying current to drive columns of the liquid crystal display panel and simultaneously minimizing power usage in accordance with the present invention. Each digital driver includes the device (400) of the present invention, i.e., the voltage transforming unit (402) and adaptive regenerative feedback circuitry (404) as described more fully above. Row drivers (718, 720, 722) provide amplification of signals to rows of the LCD panel, and controller chips (724, 726, 728, 730) drive the digital drivers.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

We claim:

1. A device for amplifying signals for supplying current to a load for a portable electronic unit and simultaneously minimizing power usage, comprising:

A) a voltage transforming unit having a first differential amplifier, a second differential amplifier and a summer, coupled to receive an input signal that is applied to the first differential amplifier and the second differential amplifier that are arranged to provide outputs to the summer to provide a first current, for transforming the input signal into the first current using a predetermined gain;

B) adaptive regenerative feedback circuitry having slew-rate based bias current, responsive to the first current and coupled to the voltage transforming unit, for providing output to a multi-transistor final output stage; and C) the multi-transistor final output stage that includes first and second preselected transistors that are coupled to the voltage transforming unit to provide feedback to the first differential amplifier and to the second differential amplifier, wherein the multi-transistor final output stage is operably coupled to the adaptive regenerative feedback circuitry, wherein a combined output of the first preselected transistor and the second preselected transistor is provided to a load.

2. The device of claim 1 wherein the adaptive regenerative feedback circuitry includes:

bias control circuitry, operably coupled to the voltage transforming unit, for providing a source/sink current by adjusting a bias current to provide a load pull-up current.

3. The device of claim 2 wherein a first transistor and two other transistors of said adaptive regenerative feedback circuitry are p-type metal-oxide-silicon transistors.

4. The device of claim 3 wherein the bias control circuitry includes eight transistors, coupled as follows:

A) a first p-type metal-oxide-silicon transistor for setting bias currents for second and third p-type metal-oxide-silicon transistors, and the first and second preselected transistors;

B) said second p-type metal-oxide-silicon transistor operably coupled to said third p-type metal-oxide-silicon transistor a mirrored device receiving an output from said third p-type metal-oxide-silicon transistor for, in response to an increase in output source current, increasing the current through a diode-connected MOSFET string;

C) said third p-type metal-oxide-silicon transistor operably coupled with said second p-type metal-oxide-silicon transistor and the first preselected transistor, a diode-connected device, for, in response to an increase in output source current, providing a signal to said second p-type metal-oxide-silicon transistor for increasing the current, I1+I2, through the diode-connected MOSFET string in response to an output from the voltage-transforming unit indicating positive slew;

D) the diode-connected MOSFET string, operably coupled to said first and second p-type metal-oxide-silicon transistors including: a first n-type metal-oxide-silicon transistor operably coupled to a fourth p-type metal-oxide-silicon transistor that is operably coupled to a second n-type metaloxide-silicon transistor, wherein the diode-connected MOSFET string is further coupled to a third n-type metal-oxide-silicon transistor that is operably coupled to said third and second p-type metal-oxide-silicon transistors, and to a fifth p-type metal-oxide-silicon transistor that is operably coupled to the voltage transforming unit, in response to current from said first and second p-type metal-oxide-silicon transistors, providing an increased feedback signal for current indicating a positive slew-rate and maintaining an existing feedback signal for current indicating a non-positive slew-rate.

5. A device for amplifying signals for supplying current to a load for a portable electronic unit and simultaneously minimizing power usage, comprising:

A) a voltage transforming unit having a first differential amplifier, a second differential amplifier and a summer, for transforming a received input voltage into a first current using a predetermined gain; and B) adaptive regenerative feedback circuitry responsive to the first current for generating a slew-rate based bias current, wherein said regenerative feedback circuitry comprises:

B1) an adaptive regenerative feedback unit, operably coupled to the voltage transforming unit and to receive the first current from the voltage transforming unit, for providing an adjusting signal for controlling a second current of an output unit wherein the second current is utilized for supplying a source/sink current to the load; and B2) the output unit, operably coupled to the voltage transforming unit and to the adaptive regenerative feedback unit, for providing a feedback signal to the voltage transforming unit and for providing the source/sink current for charging/discharging the load.

6. The device of claim 5 wherein the adaptive regenerative feedback unit includes:

bias control circuitry, operably coupled to the voltage transforming unit, for providing feedback to the voltage transforming unit and providing the source/sink current by adjusting the slew-rate based bias current to provide a load pull-up current.

7. The device of claim 6 wherein a first transistor and two other transistors of said adaptive regenerative feed back circuitry are p-type metal-oxide-silicon transistors.

8. A method for amplifying signals for supplying current to a load for a portable electronic unit and simultaneously minimizing power usage, comprising the steps of:

A) utilizing a voltage transforming unit having a first differential amplifier, a second differential amplifier and a summer wherein the voltage transforming unit is coupled to receive an input signal that is applied to the first differential amplifier and the second differential amplifier that are arranged to provide outputs to the summer to provide a first current for transforming the input signal into the first current using a predetermined gain;

B) using an adaptive regenerative feedback circuitry having slew-rate based bias current, wherein the adaptive regenerative feedback circuitry is responsive to the first current and coupled to the voltage transforming unit, and the adaptive regenerative feedback circuitry provides an output to a multi-transistor final output stage; and C) utilizing the multi-transistor final output stage that includes first and second preselected transistors that are coupled to the voltage transforming unit to provide feedback to the first differential amplifier and to the second differential amplifier, wherein the multi-transistor final output stage is operably coupled to the adaptive regenerative feedback circuitry, and wherein a combined output of the first preselected transistor and the second preselected transistor is provided to a load.

9. The method of claim 8 wherein utilizing the adaptive regenerative feedback circuitry includes the steps of:

utilizing bias control circuitry, operably coupled to the voltage transforming unit, for providing a source/sink current by adjusting the slew-rate based bias current to provide a load pull-up current.

10. The method of claim 9 wherein a first transistor and two other transistors of said adaptive regenerative feedback circuitry are p-type metal-oxide-silicon transistors.

11. An amplifier in a liquid crystal display panel for amplifying signals for supplying current to drive columns of the liquid crystal display panel and simultaneously minimizing power usage, the amplifier comprising:

A) a voltage transforming unit having a first differential amplifier, a second differential amplifier and a summer, coupled to receive an input signal that is applied to the first differential amplifier and the second differential amplifier that are arranged to provide outputs to the summer to provide a first current, for transforming the input signal into the first current using a predetermined gain;

B) adaptive regenerative feedback circuitry having slew-rate based bias current, responsive to the first current and coupled to the voltage transforming unit, for providing output to a multi-transistor final output stage; and C) the multi-transistor final output stage that includes first and second preselected transistors that are coupled to the voltage transforming unit to provide feedback to the first differential amplifier and to the second differential amplifier, wherein the multi-transistor final output stage is operably coupled to the adaptive regenerative feedback circuitry, wherein a combined output of the first preselected transistor and the second preselected transistor is provided to a load.

* * * * *